(12) United States Patent
Nishiyama

(10) Patent No.: US 7,538,629 B2
(45) Date of Patent: May 26, 2009

(54) OSCILLATOR CIRCUIT

(75) Inventor: Yoshinobu Nishiyama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 92 days.

(21) Appl. No.: 11/798,933

(22) Filed: May 17, 2007

(65) Prior Publication Data

US 2007/0268081 A1 Nov. 22, 2007

(30) Foreign Application Priority Data

May 17, 2006 (JP) .............................. 2006-137379

(51) Int. Cl.
*H03K 3/26* (2006.01)
(52) U.S. Cl. ..................... 331/111; 331/143; 331/74; 331/185
(58) Field of Classification Search ................. 331/111, 331/143, 36 C, 185, 74
See application file for complete search history.

(56) References Cited

U.S. PATENT DOCUMENTS 5,250,914 A 10/1993 Kondo 6,867,657 B2 * 3/2005 Hollinger et al. ............ 331/143

FOREIGN PATENT DOCUMENTS

JP 5-7133 1/1993
JP 2003-69341 3/2003

* cited by examiner

*Primary Examiner*—Arnold Kinkead
(74) *Attorney, Agent, or Firm*—Morrison & Foerster LLP

(57) ABSTRACT

The invention provides an oscillator circuit that reduces the dependence of an oscillation frequency on a power supply voltage. A charging and discharging circuit is a circuit switchable between an initializing operation setting an initial voltage for discharge and a discharging operation, and outputs a clock when the discharge is completed. The clock is inputted to a set terminal of a RS flip-flop. A signal formed by delaying an output signal of the RS flip-flop by a delay circuit is inputted to a reset terminal of the RS flip-flop. The output signal of the RS flip-flop is inverted to a discharge enable signal by an inverter, and the discharge enable signal is inputted to a switching circuit of the charging and discharging circuit. With this structure, the charging and discharging circuit alternately repeats the initializing operation and the discharging operation, and by the initialization the discharging operation is always started from the power supply voltage.

12 Claims, 4 Drawing Sheets reference current circuit charging and discharging circuit

OSCILLATOR CIRCUIT

CROSS-REFERENCE OF THE INVENTION

This application claims priority from Japanese Patent Application No. 2006-137379, the content of which is incorporated herein by reference in its entirety.

BACKGROUND OF THE INVENTION

1. Field of the Invention

The invention relates to an oscillator circuit, particularly to an oscillator circuit generating an oscillation output by charging and discharging a capacitor.

2. Description of the Related Art

Generally, an oscillator circuit is incorporated in a semiconductor integrated circuit such as a microcomputer in order to generate an operation clock. Hereafter, a conventional oscillator circuit will be described. FIG. 5 is a circuit diagram of the oscillator circuit.

This oscillator circuit includes a capacitor C, a Schmidt inverter STV detecting a voltage of a node N of the capacitor C, a P-channel type MOS transistor M1 and an N-channel type MOS transistor M2 where an output of the Schmidt inverter STV is inputted to respective gates through an inverter INV, a P-channel type MOS transistor M3 serially connected with the P-channel type MOS transistor M1 and flowing a reference current I1, and an N-channel type MOS transistor M4 serially connected with the N-channel type MOS transistor M2 and flowing a reference current I1. An output clock of the oscillator circuit is obtained from the inverter INV.

FIG. 6 is a circuit diagram showing a reference current circuit generating the above-mentioned reference current I1. A resistor R1 (a resistance value R1) and an N-channel type MOS transistor M5 are serially connected between a power supply terminal supplying a power supply voltage Vdd and a ground terminal supplying a ground voltage GND. In the N-channel type MOS transistor M5, a gate and a drain are commonly connected and a source is grounded. When a voltage between the gate and the source is Vgs1, the reference current I1 flows through the N-channel type MOS transistor M5. The reference current I1 is given by the equation 1.

$$I1 = \frac{Vdd - Vgs1}{R1} \quad \text{Equation 1}$$

This reference current I1 flows through an N-channel type MOS transistor M6 of a current mirror. The reference current I1 also flows through a P-channel type MOS transistor M7 serially connected with the N-channel type MOS transistor M6.

A gate voltage Va of the P-channel type MOS transistor M7 is applied to a gate of the P-channel type MOS transistor M3 in FIG. 5, and a gate voltage Vb of the N-channel type MOS transistor M6 is applied to a gate of the N-channel type MOS transistor M4 in FIG. 5.

The operation of this oscillator circuit will be described referring to a waveform diagram in FIG. 7. It is assumed that the Schmidt inverter STV has two thresholds Vt1 and Vt2 (Vt1>Vt2). When the voltage of the node N (a terminal of the capacitor C) is increased and reaches the threshold Vt1 of the Schmidt inverter STV by charging the capacitor C by the reference current I1, an output of the Schmidt inverter STV is inverted to the low level, an output of the inverter INV turns to the high level, and correspondingly M2 turns on and M1 turns off. The voltage of the node N of the capacitor C is then decreased by discharging the capacitor C by the reference current I1, and when the voltage reaches the threshold Vt2 of the Schmidt inverter STV, the output of the Schmidt inverter STV is inverted to the high level, the output of the inverter INV turns to the low level, and correspondingly M2 turns off and M1 turns on. Then, the charging of the capacitor C by the reference current I1 is started again. By repeating the charge and the discharge in this manner, the output clock is obtained from the inverter INV. The relevant technology is described in Japanese Patent Application Publication No. 2003-69341.

It is preferable that the oscillation frequency of the oscillator circuit incorporated in the semiconductor integrated circuit does not change even when the power supply voltage Vdd applied to the semiconductor integrated circuit changes due to deterioration of a battery or the like. However, the conventional oscillator circuit has a problem of high dependence of the oscillation frequency on the power supply voltage.

SUMMARY OF THE INVENTION

The invention provides an oscillator circuit including: a reference current circuit generating a reference current; a capacitor; a charging and discharging circuit comprising a switching circuit switching between an initializing operation initializing a voltage of a terminal of the capacitor to a power supply voltage and a discharging operation flowing the reference current to the capacitor, and a detection circuit detecting the voltage of the terminal of the capacitor and outputting a clock based on the detection; and a control circuit controlling the switching circuit so that the charging and discharging circuit starts the initializing operation in response to the clock and starts the discharging operation after the initializing operation.

In the invention, the charging and discharging circuit alternately repeats the initializing operation and the discharging operation, and by the initialization the discharging operation is always started from the power supply voltage. This reduces the dependence of an oscillation frequency on the power supply voltage.

Furthermore, the same effect is obtained by setting the voltage to be initialized to the ground voltage instead of to the power supply voltage and starting charging the capacitor from the ground voltage.

DETAILED DESCRIPTION OF THE INVENTION

Figure 1:
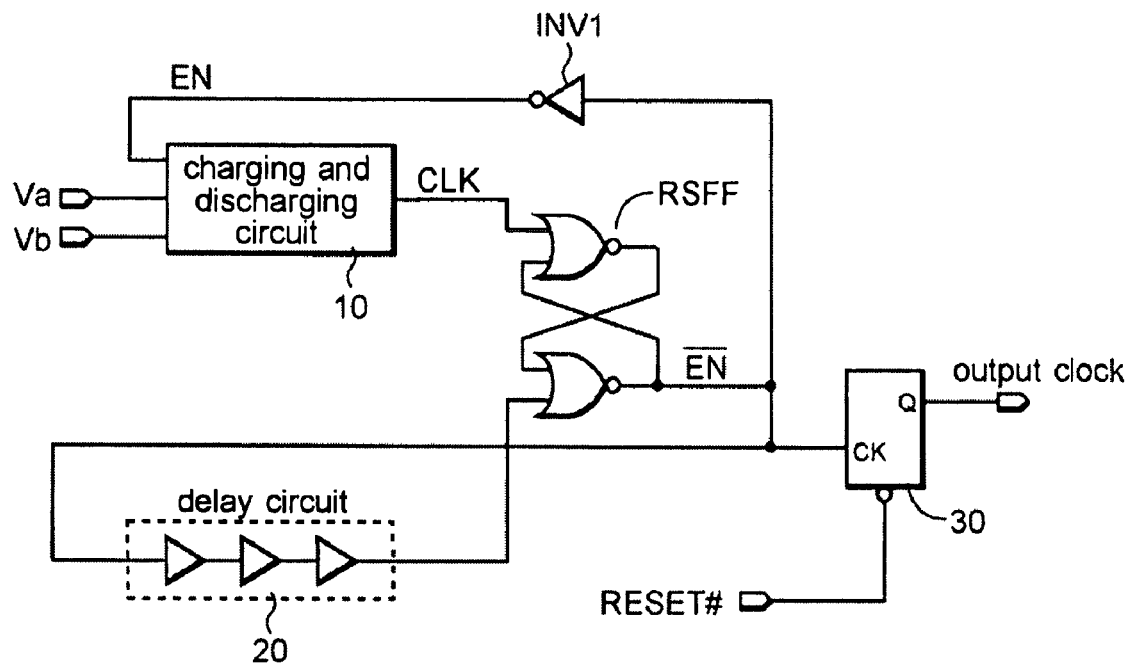
FIG. 1 is a circuit diagram of an oscillator circuit of a first embodiment of the invention.
Figure 2:
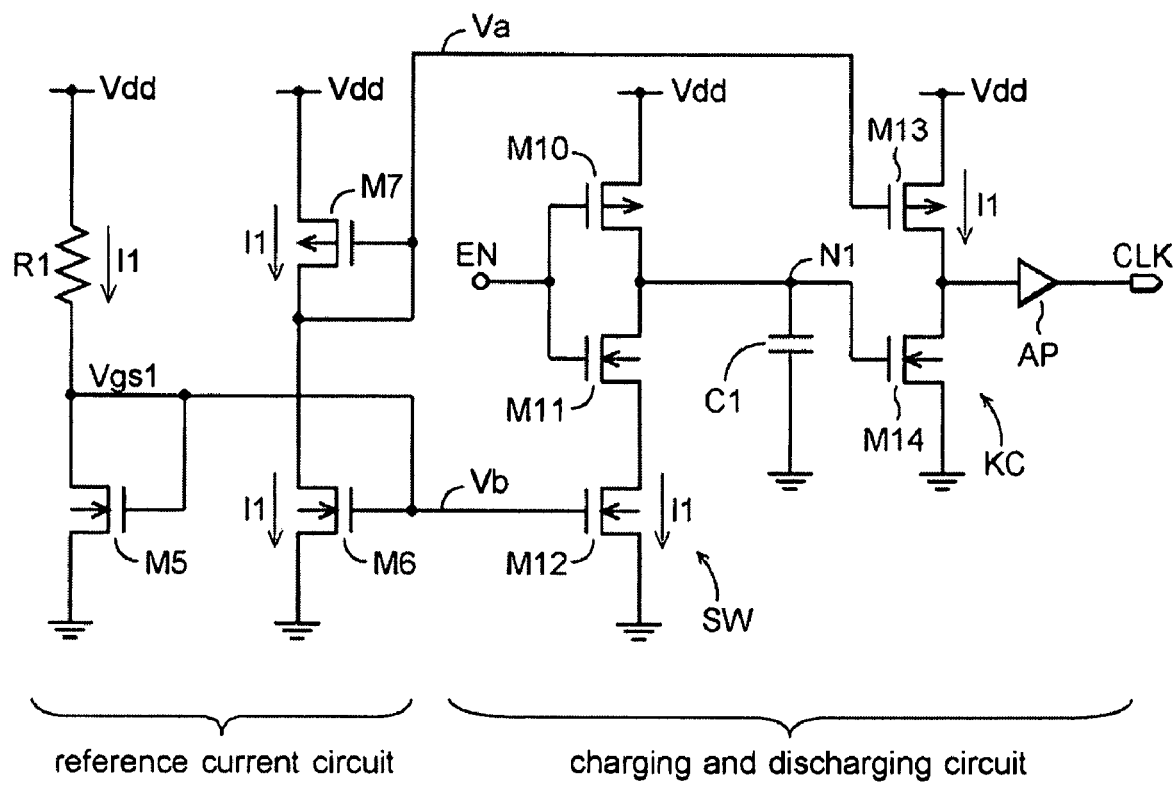
FIG. 2 is a circuit diagram of a charging and discharging circuit of the oscillator circuit of the first embodiment of the invention.
Figure 3:
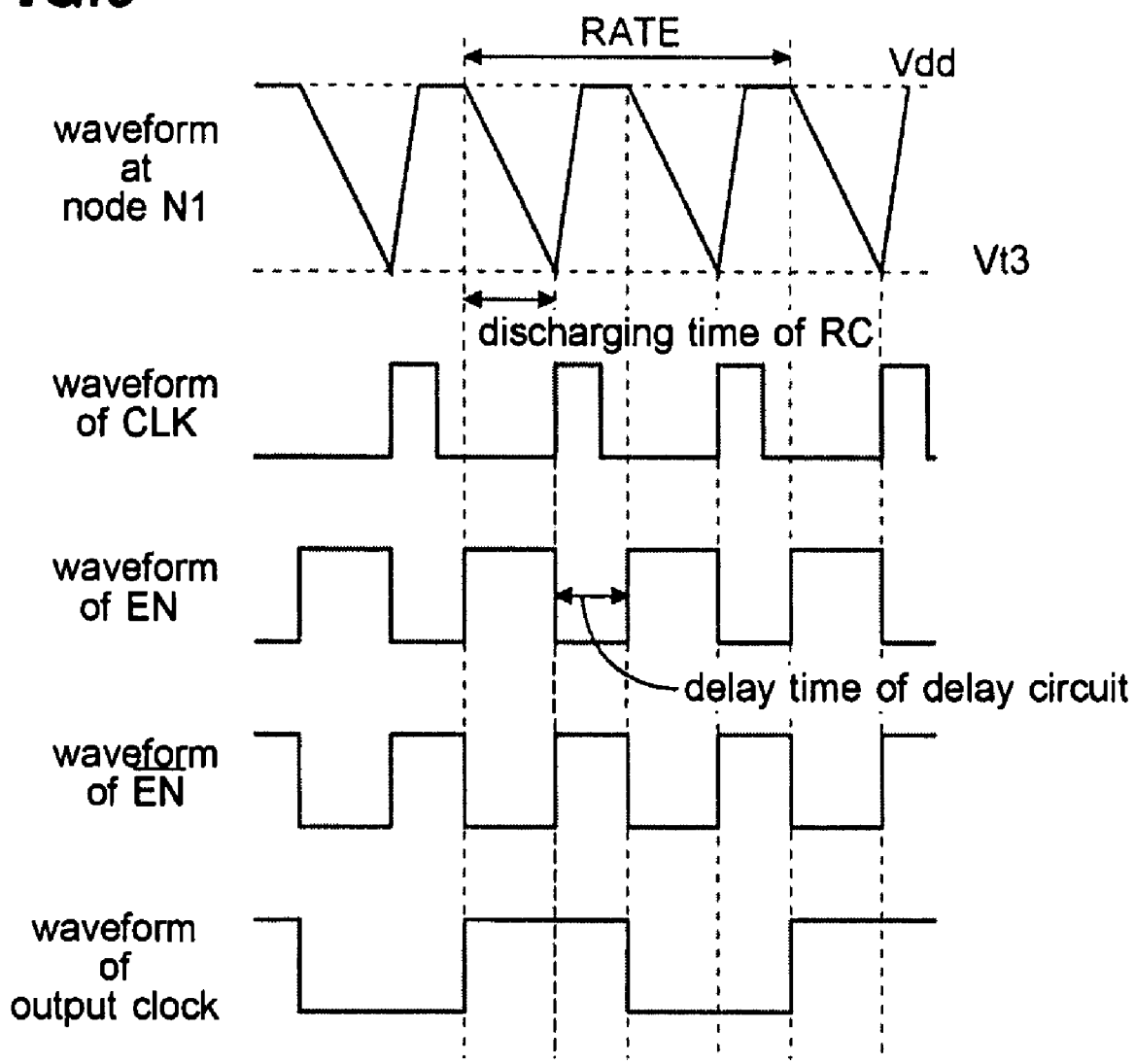
FIG. 3 is an operation waveform diagram of the oscillator circuit of the first embodiment of the invention.

An oscillator circuit of a first embodiment of the invention will be described referring to FIGS. 1 to 3. FIG. 1 is a circuit diagram of the oscillator circuit. FIG. 2 is a circuit diagram of a charging and discharging circuit 10.

The charging and discharging circuit 10 is a circuit switchable between an initializing operation setting an initial voltage for discharge and a discharging operation, and outputs a clock CLK when the discharge is completed. The clock CLK is inputted to a set terminal of a RS flip-flop RSFF. A signal formed by delaying an output signal/EN of the RS (set-reset input type) flip-flop RSFF by a delay circuit 20 is inputted to a reset terminal of the RS flip-flop RSFF. That is, this RS flip-flop RSFF is set by the rise of the clock CLK and reset by the signal formed by delaying the output of the RS flip-flop RSFF.

The output signal/EN of the RS flip-flop RSFF is inverted to a discharge enable signal EN by an inverter INV1, and the discharge enable signal EN is inputted to a switching circuit SW of the charging and discharging circuit 10. The discharging operation is performed when the discharge enable signal EN is high, and the initializing operation is performed when the discharge enable signal EN is low.

The output signal/EN of the RS flip-flop RSFF is inputted to a clock input terminal CK of a toggle flip-flop (TFF) 30, and an output clock is obtained from this toggle flip-flop 30.

Figure 6:
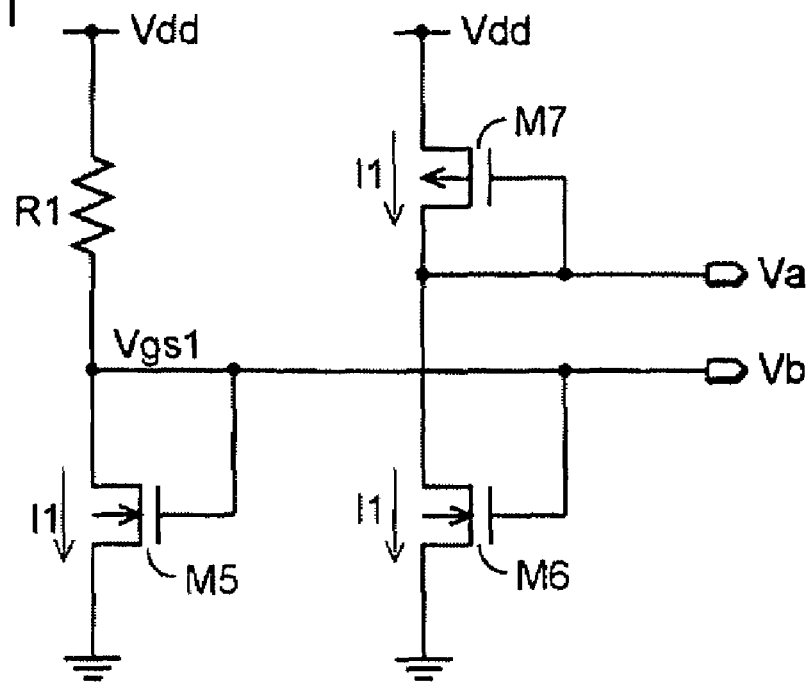
FIG. 6 is a circuit diagram of a reference current circuit.
Figure 7:
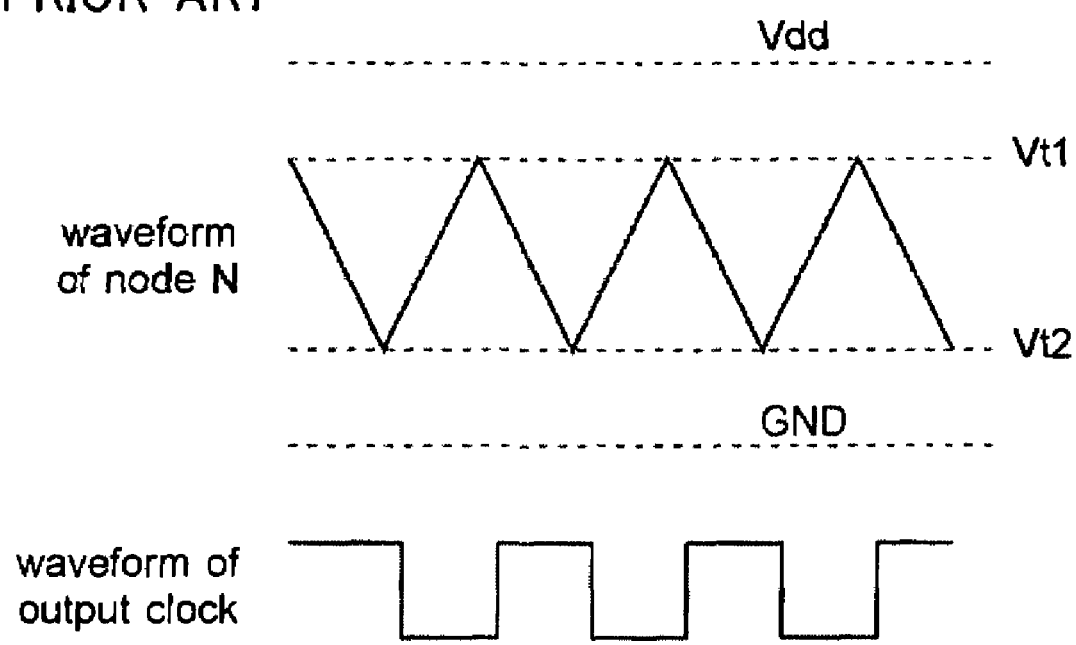
FIG. 7 is an operation waveform diagram of the conventional oscillator circuit.

The charging and discharging circuit 10 includes a capacitor C1, a switching circuit SW and a detection circuit KC as shown in FIG. 2. The switching circuit SW includes a P-channel type MOS transistor M10 and an N-channel type MOS transistor M11 forming an inverter, and an N-channel type MOS transistor M12 serially connected to these transistors and flowing a reference current I1 generated by a reference current circuit. The reference current circuit is the same circuit as the circuit shown in FIG. 6. The discharge enable signal EN is inputted to the inverter.

An output of the switching circuit SW is connected with a terminal (a node N1) of the capacitor C1 and inputted to the detection circuit KC. The detection circuit KC is a kind of inverter, and includes a P-channel type MOS transistor M13 and an N-channel type MOS transistor M14 that are serially connected. A voltage Va of the reference current circuit is applied to a gate of the P-channel type MOS transistor M13 to flow the reference current I1. The output of the switching circuit SW is applied to a gate of the P-channel type MOS transistor M14. Therefore, a threshold Vt3 of the detection circuit KC is set to an equal value to the voltage between the gate and the source Vgs1 of the N-channel type MOS transistor M5 of the reference current circuit (Vt3=Vgs1). An output of the detection circuit KC is applied to a buffer amplifier AP, and an output of the buffer amplifier AP is outputted as the clock CLK.

Next, the operation of this oscillator circuit will be described referring to FIG. 3. Assuming that the discharge enable signal EN is high, in the charging and discharging circuit 10, M10 turns off, M11 turns on, and the capacitor C1 is discharged by the reference current I1. When the node N1 of the capacitor C1 is decreased from the power supply voltage Vdd to Vt3 by the discharge, the output of the detection circuit KC is inverted to the high level and the clock CLK turns to the high level.

Then, the output signal/EN of the RS flip-flop RSFF is inverted to the high level and the discharge enable signal EN turns to the low level. When the discharge enable signal EN turns to the low level, in the charging and discharging circuit 10, M10 turns on and M11 turns off in the switching circuit SW, so that the capacitor C1 is charged and the voltage of the node N1 is initialized to the power supply voltage Vdd.

The output signal/EN of the RS flip-flop RSFF turns to the high level by its inversion and the output signal/EN is delayed by the delay circuit 20. Then, the output signal/EN of the RS flip-flop RSFF is inverted to the low level after the delay time, the discharge enable signal EN turns to the high level, and the capacitor C1 starts being discharged by the reference current I1 in the charging and discharging circuit 10. Here, the delay time by the delay circuit 20 is longer than time necessary for the initialization.

In this manner, in the charging and discharging circuit 10, the initializing operation and the discharging operation are alternately repeated and the discharge is always started from the power supply voltage Vdd. This reduces the dependence of an oscillation frequency on the power supply voltage. Since the initial voltage of the node N1 is always at the power supply voltage Vdd, time t necessary for one discharge is given by the equation 2.

$$t = \frac{C1 \times (Vdd - Vt3)}{I1}$$ [Equation 2]

Here, since the reference current I1 is given by the equation 1, the equation 3 is obtained by substituting this for I1 in the equation 2.

$$t = \frac{C1 \times R1 \times (Vdd - Vt3)}{Vdd - Vgs1}$$ [Equation 3]

Here, by setting Vt3=Vgs1 as described above, the dependence of time t on the power supply voltage is cancelled as shown by the equation 4.

$$t = C1 \times R1$$ [Equation 4]

Figure 4:
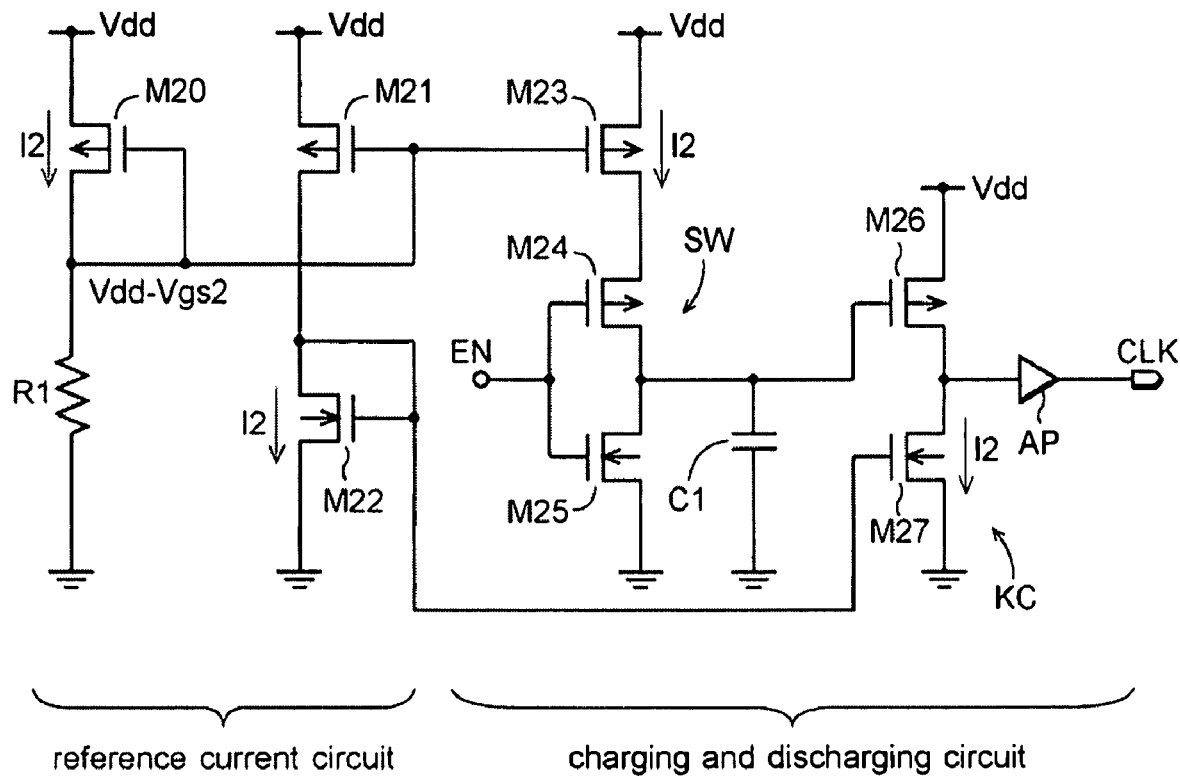
FIG. 4 is a circuit diagram of an oscillator circuit of a second embodiment of the invention.
Figure 5:
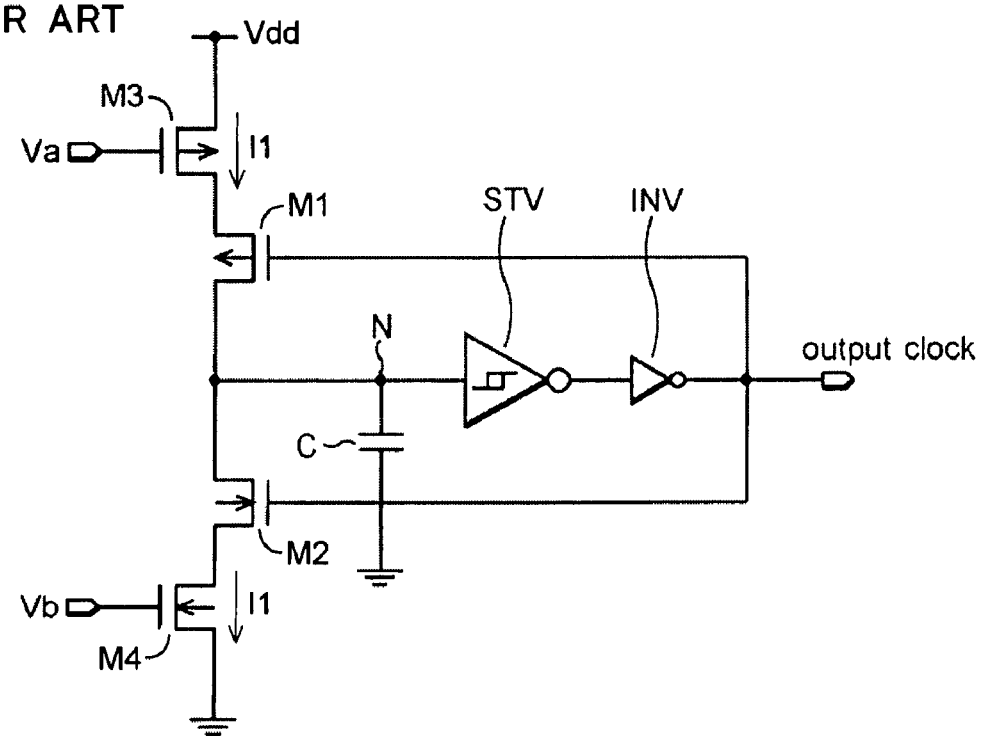
FIG. 5 is a circuit diagram of a conventional oscillator circuit.

Next, an oscillator circuit of a second embodiment of the invention will be described. While the first embodiment is described on the circuit that initializes the voltage to the power supply voltage Vdd and performs the discharge, the same effect is obtained by a circuit that initializes the voltage to the ground voltage GND and performs charge. In this case, the charging and discharging circuit is configured as shown in FIG. 4. In FIG. 4, a reference current circuit has transistors of which the polarities are inverted, and includes P-channel type MOS transistors M20 and M21 and an N-channel type MOS transistor M22.

A switching circuit SW includes a P-channel type MOS transistor M23 flowing a reference current I2 supplied from the reference current generation circuit, and a P-channel type MOS transistor M24 and an N-channel type MOS transistor M25 forming an inverter. Here, the reference current I2 is given by the equation 5.

$$I2 = \frac{Vdd - Vgs2}{R1}$$ [Equation 5]

A detection circuit KC includes a P-channel type MOS transistor M26 and an N-channel type MOS transistor M27 that are serially connected. The N-channel type MOS transistor M27 forms a current mirror with the N-channel type MOS transistor M22 of the reference current circuit, and the reference current I2 flows therethrough. An output of the switching circuit SW is applied to a gate of the P-channel type MOS transistor M26. Therefore, a threshold Vt3 of the detection circuit KC is set to an equal value to Vgs2 of the reference current circuit. With this structure, the charging and discharging circuit repeats the initialization and the charge, and the charge is always started from the ground voltage GND. This reduces the dependence of the oscillation frequency on the power supply voltage in the similar manner to the first embodiment.

The oscillator circuits of these embodiments reduce the dependence of the oscillation frequency on the power supply voltage.

What is claimed is:

1. An oscillator circuit comprising:
    a reference current circuit generating a reference current;
    a charging and discharging circuit comprising a capacitor, a switching circuit switching the charging and discharging circuit from an initializing operation initializing a voltage of a terminal of the capacitor to a power supply voltage to a discharging operation allowing the reference current to flow from the capacitor and switching the charging and discharging circuit from the discharging operation to the initializing operation, and a detection circuit detecting the voltage of the terminal of the capacitor and outputting a clock based on the detection; and
    a control circuit controlling the switching circuit so that the charging and discharging circuit starts the initializing operation in response to the clock and starts the discharging operation after the initializing operation,
    wherein the control circuit comprises a delay circuit and a flip-flop, the clock being inputted to a first input terminal of the flip-flop, an output of the flip-flop being inputted to a second input terminal of the flip-flop through the delay circuit, and the output of the flip-flop being applied to the switching circuit.

2. The oscillator circuit of claim 1, wherein the flip-flop comprises a RS flip-flop.

3. The oscillator circuit of claim 1, further comprising a toggle flip-flop connected with an output of the flip-flop.

4. The oscillator circuit of claim 1, wherein the reference current circuit comprises a resistor and a MOS transistor serially connected between a power supply terminal and a ground terminal, and a gate and a drain of the MOS transistor are connected.

5. The oscillator circuit of claim 4, wherein a threshold of the detection circuit is set to equal to a voltage between a gate and a source of the MOS transistor.

6. The oscillator circuit of claim 1, wherein the detection circuit comprises an inverter.

7. An oscillator circuit comprising:
    a reference current circuit generating a reference current;
    a charging and discharging circuit comprising a capacitor, a switching circuit switching the charging and discharging circuit from an initializing operation initializing a voltage of a terminal of the capacitor to a ground voltage to a charging operation allowing the reference current to flow to the capacitor and switching the charging and discharging circuit from the charging operation to the initializing operation, and a detection circuit detecting the voltage of the terminal of the capacitor and outputting a clock based on the detection; and
    a control circuit controlling the switching circuit so that the charging and discharging circuit starts the initializing operation in response to the clock and starts the charging operation after the initializing operation,
    wherein the control circuit comprises a delay circuit and a flip-flop, the clock being inputted to a first input terminal of the flip-flop, an output of the flip-flop being inputted to a second input terminal of the flip-flop through the delay circuit, and the output of the flip-flop being applied to the switching circuit.

8. The oscillator circuit of claim 7, wherein the flip-flop comprises a RS flip-flop.

9. The oscillator circuit of claim 7, further comprising a toggle flip-flop connected with an output of the flip-flop.

10. The oscillator circuit of claim 7, wherein the reference current circuit comprises a resistor and a MOS transistor serially connected between a power supply terminal and a ground terminal, and a gate and a drain of the MOS transistor are connected.

11. The oscillator circuit of claim 10, wherein a threshold of the detection circuit is set to equal to a voltage between a gate and a source of the MOS transistor.

12. The oscillator circuit of claim 7, wherein the detection circuit comprises an inverter.

* * * * *